(12) United States Patent
Ye (10) Patent No.: US 11,863,853 B2
(45) Date of Patent: Jan. 2, 2024

(54) DISPLAY PANEL AND DISPLAY DEVICE (71) Applicant: Wuhan China Star Optoelectronics Semiconductor Display Technology Co., Ltd., Wuhan (CN)

(72) Inventor: Jian Ye, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/262,761

(22) PCT Filed: Oct. 23, 2020

(86) PCT No.: PCT/CN2020/123142
§ 371 (c)(1),
(2) Date: Jan. 25, 2021

(87) PCT Pub. No.: WO2022/052226
PCT Pub. Date: Mar. 17, 2022

(65) Prior Publication Data
US 2023/0209164 A1 Jun. 29, 2023

(30) Foreign Application Priority Data
Sep. 10, 2020 (CN) .......................... 202010944744.4

(51) Int. Cl.
H04N 23/55 (2023.01)
H10K 59/35 (2023.01)
(Continued)

(52) U.S. Cl.
CPC .......... *H04N 23/55* (2023.01); *H04M 1/0264* (2013.01); *H04M 1/0266* (2013.01); *H10K 59/131* (2023.02); *H10K 59/353* (2023.02)

(58) Field of Classification Search
CPC ....................... H04M 1/0264; H04M 1/0266; H10K 59/121; H10K 59/353; H10K 59/131; H04N 23/55; H04N 23/57
(Continued)

(56) References Cited

U.S. PATENT DOCUMENTS 9,767,728 B2 * 9/2017 Evans, V ........... G02B 27/0093
9,823,694 B2 * 11/2017 Evans, V .......... G02F 1/133514
(Continued)

FOREIGN PATENT DOCUMENTS

CN 107610635 A 1/2018
CN 108389879 A 8/2018
(Continued)

*Primary Examiner* — Pritham D Prabhakher
(74) *Attorney, Agent, or Firm* — Nathan & Associates; Menachem Nathan (57) ABSTRACT A display panel and a display device are provided. A display area of the display panel is provided with a plurality of transistor units and first light-emitting pixel units driven by the transistor units; and an under-screen camera area of the display panel is only provided with a plurality of second light-emitting pixel units, the transistor units are disposed surrounding the under-screen camera area, and each of the transistor units disposed surrounding the under-screen camera area in the display area is electrically connected to a plurality of the second light-emitting pixel units by each of conductive wires.

10 Claims, 5 Drawing Sheets (51) Int. Cl.
*H10K 59/131* (2023.01)
*H04M 1/02* (2006.01)

(58) Field of Classification Search
USPC .......................................................... 348/374
See application file for complete search history.

(56) References Cited

U.S. PATENT DOCUMENTS

| | | | | |
|---|---|---|---|---|
| 9,870,024 | B2* | 1/2018 | Evans, V | H04N 23/57 |
| 10,102,789 | B2* | 10/2018 | Evans, V | G09G 3/2092 |
| 10,754,455 | B2* | 8/2020 | Hwang | G06F 1/1686 |
| 10,903,291 | B2* | 1/2021 | Ding | H10K 59/50 |
| 11,152,433 | B2* | 10/2021 | Liu | H10K 59/121 |
| 11,181,945 | B2* | 11/2021 | Ma | H10K 59/131 |
| 11,309,502 | B2* | 4/2022 | Zhang | G06F 1/3215 |
| 11,462,590 | B2* | 10/2022 | Fan | H10K 59/65 |
| 11,515,375 | B2* | 11/2022 | Zhang | H10K 59/126 |
| 2013/0222687 | A1* | 8/2013 | Shirakata | G03B 17/04 |
| | | | | 348/374 |
| 2017/0251137 | A1* | 8/2017 | Evans, V | G02F 1/1368 |
| 2019/0326366 | A1* | 10/2019 | Fan | H10K 59/35 |
| 2019/0393286 | A1* | 12/2019 | Ding | H10K 59/60 |
| 2020/0066809 | A1* | 2/2020 | Liu | G09G 3/3225 |
| 2020/0104562 | A1* | 4/2020 | Sung | H10K 59/60 |
| 2020/0373372 | A1* | 11/2020 | Chung | H10K 77/111 |
| 2021/0117639 | A1* | 4/2021 | Yang | G06V 40/1318 |
| 2021/0208633 | A1* | 7/2021 | Ma | G06F 1/1686 |
| 2021/0376267 | A1* | 12/2021 | Zhang | G06F 1/1626 |
| 2021/0408194 | A1* | 12/2021 | Zhang | H10K 59/126 |

FOREIGN PATENT DOCUMENTS

| | | |
|---|---|---|
| CN | 108520888 A | 9/2018 |
| CN | 110278300 A | 9/2019 |
| CN | 110504287 A | 11/2019 |
| CN | 210120138 U | 2/2020 |
| CN | 210516000 U | 5/2020 |
| CN | 111312781 A | 6/2020 |

* cited by examiner

DISPLAY PANEL AND DISPLAY DEVICE

FIELD OF INVENTION

The present disclosure relates to the field of display technologies, and more particularly, to a display panel and a display device.

BACKGROUND OF INVENTION

With rapid development of smart phones toward full screen, a requirement for screen ratio is getting higher, such as a current notch design of iPhone X, which only reserves a space for a front camera on a "forehead" of a mobile phone, while other areas are all display areas.

A circular hole-opening design is used in screens, which opens a circular hole in a position corresponding to a camera, thereby making the "forehead" of smart phones further narrowed and closer to full screen than a notch screen. Therefore, a larger screen ratio can be achieved.

In order to further improve the screen ratio without destroying integrity of display, the notch screen or hole-opening design is not allowed in an effective display area. Therefore, an idea to dispose cameras under screens emerged, and a top of the cameras can still display normally while taking pictures, that is an under-screen camera technique we are talking about.

However, based on structures of current organic light-emitting diode (OLED) display panels, and due to multi-layered, dense, and irregular metal lines of array substrates, theses opaque metal lines cause actual transmittance of the organic light-emitting diode display panels to be very low, and slit diffraction occurs between fine and small metal lines, which results in a lot of stray light, thereby seriously affecting image quality of under-screen cameras. Specifically, drive transistors (TFTs) of conventional organic light-emitting diode (OLED) display screens are disposed directly below light-emitting pixel units (pixels) which are driven by them. Since the drive transistors include multi-layered metal lines in a stack, such as active layers, gate electrode layers, and source/drain electrode layers, theses opaque metal lines cause actual transmittance of the organic light-emitting diode display screens to be very low, and slit diffraction occurs between fine and small metal lines, which results in a lot of stray light, thereby seriously affecting the image quality of under-screen cameras.

Therefore, how to improve transmittance in camera areas of the organic light-emitting diode display panels and reduce influences of diffracted light from metal slits have become key factors for realizing the under-screen camera technique.

Technical problem: objectives of the present disclosure are to provide a display panel and a display device, which can solve a technical problem of lower transmittance in an under-screen camera (camera-under-panel, CUP) area, thereby improving an intensity of light passing through the under-screen camera area and transmittance of the under-screen camera area, and reducing influences of diffracted light from metal slits.

SUMMARY OF INVENTION

In order to solve the above problems, the present disclosure provides a display panel, which is provided with a display area and an under-screen camera area. The display area is provided with a plurality of transistor units and first light-emitting pixel units driven by the transistor units; and the under-screen camera area is provided with a plurality of second light-emitting pixel units, the transistor units are disposed surrounding the under-screen camera area, and each of the transistor units disposed surrounding the under-screen camera area in the display area is electrically connected to a plurality of the second light-emitting pixel units by each of conductive wires. Connections among the transistor units, the first light-emitting pixel units, and the second light-emitting pixel units adopt pixel circuits of 7T1C.

Further, a density of the second light-emitting pixel units in the under-screen camera area is less than or equal to a density of the first light-emitting pixel units in the display area.

Further, each of the second light-emitting pixel units includes at least one red sub-pixel, at least one green sub-pixel, and at least one blue sub-pixel arranged in the under-screen camera area in an array. One of the conductive wires is electrically connected to the at least one red sub-pixel; and/or another one of the conductive wires is electrically connected to the at least one green sub-pixel; and/or yet another one of the conductive wires is electrically connected to the at least one blue sub-pixel.

Further, one of the transistor units is electrically connected to a plurality of red sub-pixels positioned in a same row by the one of the conductive wires, and another one of the transistor units is electrically connected to a plurality of blue sub-pixels positioned in the same row by the yet another one of the conductive wires.

Further, the red sub-pixels and the blue sub-pixels positioned in the same row are disposed alternatingly and spaced apart from each other, and the one of the conductive wires connected to the red sub-pixels and the yet another one of the conductive wires connected to the blue sub-pixels are respectively disposed on both sides of the row of the sub-pixels.

Further, the one of the transistor units is electrically connected to two of the red sub-pixels adjacent to each other and positioned in the same row by the one of the conductive wires, and the another one of the transistor units is electrically connected to two of the blue sub-pixels adjacent to each other and positioned in the same row by the yet another one of the conductive wires.

Further, yet another one of the transistor units is electrically connected to a plurality of green sub-pixels positioned in another same row by the another one of the conductive wires.

Further, the yet another one of the transistor units is electrically connected to four of the green sub-pixels surrounding one of the red sub-pixels or the blue sub-pixels by the another one of the conductive wires.

Further, the conductive wires are linear, wavy, arc-shaped, or S-shaped.

Further, each of the transistor units include a substrate layer, an active layer, a first gate insulating layer, a gate electrode layer, a second gate insulating layer, a source/drain electrode layer, and a first planarization layer. Specifically, the substrate layer includes a flexible substrate layer and a buffer layer, and the flexible substrate layer and the buffer layer may be disposed in multiple layers. The active layer is disposed on the substrate layer, the first gate insulating layer is disposed on the active layer, the gate electrode layer is disposed on the first gate insulating layer, and the second gate insulating layer is disposed on the gate electrode layer. The source/drain electrode layer is disposed on the second gate insulating layer and electrically connected to the active layer, and the first planarization layer is disposed on the source/drain electrode layer. Wherein, the conductive wires are disposed on the first planarization layer and electrically connected to the source/drain electrode layer.

Further, a material of the conductive wires and/or the source/drain electrode layer is indium tin oxide.

Further, the display panel also includes a second planarization layer disposed on the conductive wires and provided with via holes for the wires, and the conductive wires penetrate through the via holes to be electrically connected to the second light-emitting pixel units.

Further, the display panel also includes a pixel definition layer disposed on the second planarization layer and provided with grooves corresponding to the conductive wires, and the first light-emitting pixel units and the second light-emitting pixel units are disposed in the grooves.

Further, the display panel also includes a thin film encapsulation layer disposed on the pixel definition layer and covering the first light-emitting pixel units and the second light-emitting pixel units.

Further, each of the second light-emitting pixel units includes an anode layer, a light-emitting layer, and a cathode layer. Each anode layer is electrically connected to each of the conductive wires, the light-emitting layer is disposed on the anode layer, and the cathode layer is disposed on the light-emitting layer.

The present disclosure further provides a display device, which includes the display panel described above and a sensor, wherein, the sensor is disposed corresponding to the under-screen camera area.

Further, the sensor includes one of a camera sensor, a breathing light sensor, a distance sensor, a fingerprint scanner sensor, a microphone sensor, or a transparent antenna sensor or combinations thereof.

Beneficial effect: compared to current technology, beneficial effects of the present disclosure are that the display panel and the display device provided can improve transmittance of the under-screen camera area by driving one or more of the second light-emitting pixel units by each of the transistor units positioned surrounding the under-screen camera area, which electrically connects anode layers corresponding to sub-pixels having different colors together by the conductive wires inside or outside the under-screen camera area, thereby improving an intensity of light passing through the under-screen camera area, enhancing sensitivity of an under-screen camera in the under-screen camera area, and reducing influences of diffracted light from metal slits.

Elements in the drawings are designated by reference numerals listed below.

1. Transistor units; 2. first light-emitting pixel units; 3. second light-emitting pixel units;
4. conductive wires; 5. thin film encapsulation layer;
10. display area; 20. under-screen camera area; 30. sensor;
31. red sub-pixel; 32. green sub-pixel; 33. blue sub-pixel;
51. first inorganic layer; 52. organic layer; 53. second inorganic layer;
100. display panel; 101. substrate layer; 102. active layer;
103. first gate insulating layer; 104. gate electrode layer; 105. second gate insulating layer;
106. capacitor metal layer; 107. interlayer insulating layer; 108. source/drain electrode layer;
109. first planarization layer; 110. second planarization layer; 111. pixel definition layer;
121. flexible substrate layer; 122. buffer layer; 200. display device;
301. anode layer; 302. light-emitting layer; 303. cathode layer.

DETAILED DESCRIPTION OF PREFERRED EMBODIMENTS

The technical solutions in the embodiments of the present disclosure will be clearly and completely described below with reference to the drawings in the embodiments of the present disclosure. Obviously, the described embodiments are only a part of the embodiments of the present disclosure, but not all the embodiments. Based on the embodiments in the present disclosure, all other embodiments obtained by those skilled in the art without creative efforts are within the scope of the present disclosure.

In addition, terms such as "first" and "second" are used herein for purposes of description and are not intended to indicate or imply relative importance or implicitly indicating the number of technical features indicated. Thus, features limited by "first" and "second" are intended to indicate or imply including one or more than one these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrate connection; it can mean a mechanical connection, an electrical connection, or can communicate with each other; it can mean a direct connection, an indirect connection by an intermediate, or an inner communication or an inter-reaction between two elements. A person skilled in the art should understand the specific meanings in the present disclosure according to specific situations.

In the drawings, the thickness of layers and regions are exaggerated for clarity. For example, the thickness and size of the elements in the drawings are arbitrarily shown for ease of description, and thus the technical scope described is not limited by the drawings.

Embodiment 1

Figure 1:
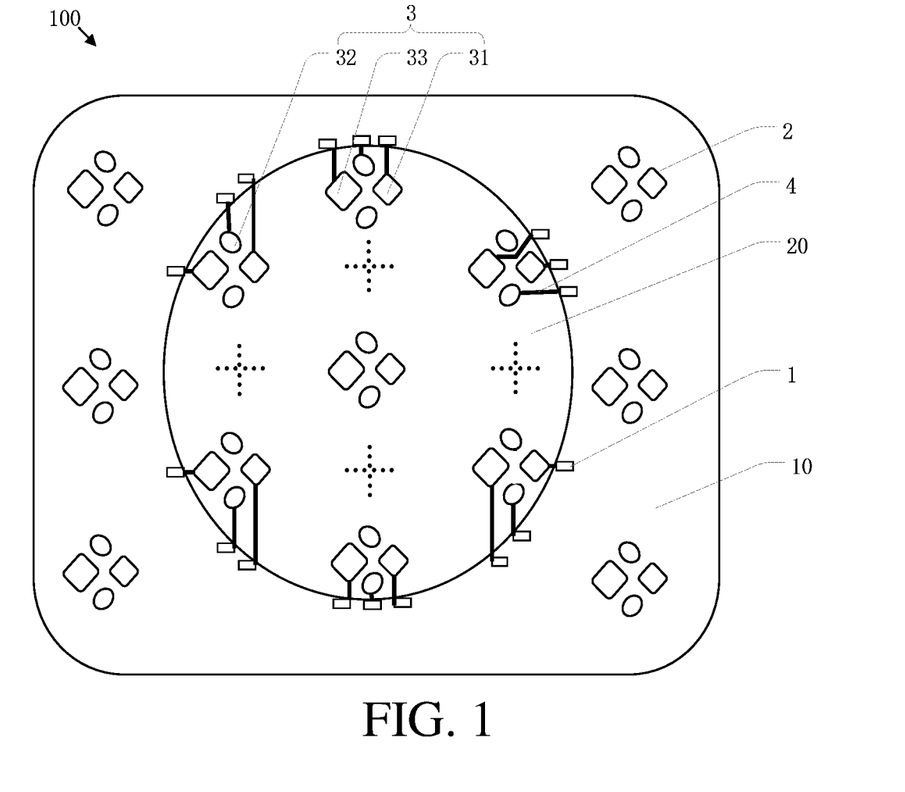
FIG. 1 is a schematic planar structural diagram of a display panel according to embodiment 1 of the present disclosure.

Referring to FIG. 1, embodiment 1 of the present disclosure provides a display panel 100, which is provided with a display area 10 and an under-screen camera area 20. The under-screen camera area 20 is any one of circular, rectangular, rounded rectangular, or irregular polygonal. The display area 10 is provided with a plurality of transistor units 1 and first light-emitting pixel units 2 driven by the transistor units 1; and the under-screen camera area 20 is not provided with the transistor units 1 but only provided with a plurality of second light-emitting pixel units 3, the transistor units 1 are disposed surrounding the under-screen camera area 20, and each of the transistor units disposed surrounding the under-screen camera area 20 in the display area 10 is electrically connected to a plurality of the second light-emitting pixel units 3 by each of conductive wires 4.

Figure 2:
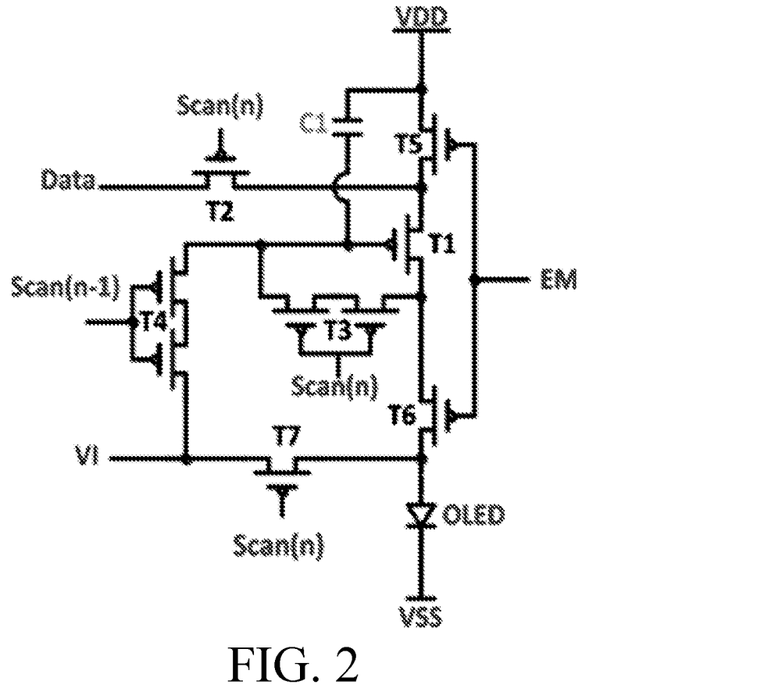
FIG. 2 is a schematic structural diagram of a 7T1C pixel circuit according to an embodiment of the present disclosure.

Referring to FIG. 2, pixel circuits having structures such as 7T1C or 6T1C are adopted in the under-screen camera area 20 to allow the transistor units 1 to be connected to the first light-emitting pixel units 2 or the second light-emitting pixel units 3, thereby driving the first light-emitting pixel units 2 or the second light-emitting pixel units 3 to emit light. As shown in FIG. 2, FIG. 2 is a schematic structural diagram of a 7T1C pixel circuit, which includes seven transistor units T1 to T7 and one capacitor C1. One second light-emitting pixel unit 3 positioned on an inner edge of the under-screen camera area 20 corresponds to one 7T1C pixel circuit which drives the second light-emitting pixel unit 3 to emit light. A density of the second light-emitting pixel units 3 in the under-screen camera area 20 is less than or equal to a density of the first light-emitting pixel units 2 in the display area 10.

As shown in FIG. 1, in this embodiment, each of the second light-emitting pixel units 3 includes at least one red sub-pixel 31, at least one green sub-pixel 32, and at least one blue sub-pixel 33 arranged in the under-screen camera area 20 in an array. One of the conductive wires 4 is electrically connected to the at least one red sub-pixel 31; and/or another one of the conductive wires 4 is electrically connected to the at least one green sub-pixel 32; and/or yet another one of the conductive wires 4 is electrically connected to the at least one blue sub-pixel 33. In this way, the conductive wires 4 are linear, wavy, arc-shaped, or S-shaped.

Wherein, the sub-pixels of the second light-emitting pixel units 3 are arranged spaced apart from each other in the under-screen camera area 20 in the array, which is preferably arranged in a diamond shape, that is, grooves are also arranged in the diamond shape. An area of the at least one green sub-pixel 32 is less than an area of the at least one blue sub-pixel 33, and an area of the at least one red sub-pixel 31 is between the area of the at least one green sub-pixel 32 and the area of the at least one blue sub-pixel 33.

Specifically, since the sub-pixels requiring to be connected are usually a lot while space for wires is limited, when the transistor units 1 positioned outside the under-screen camera area 20 are connected to anode layers 301 corresponding to the second light-emitting pixel units 3 in the under-screen camera area 20, multiple layers of the conductive wires 4 are required for performing upper and lower layered wirings.

Figure 3:
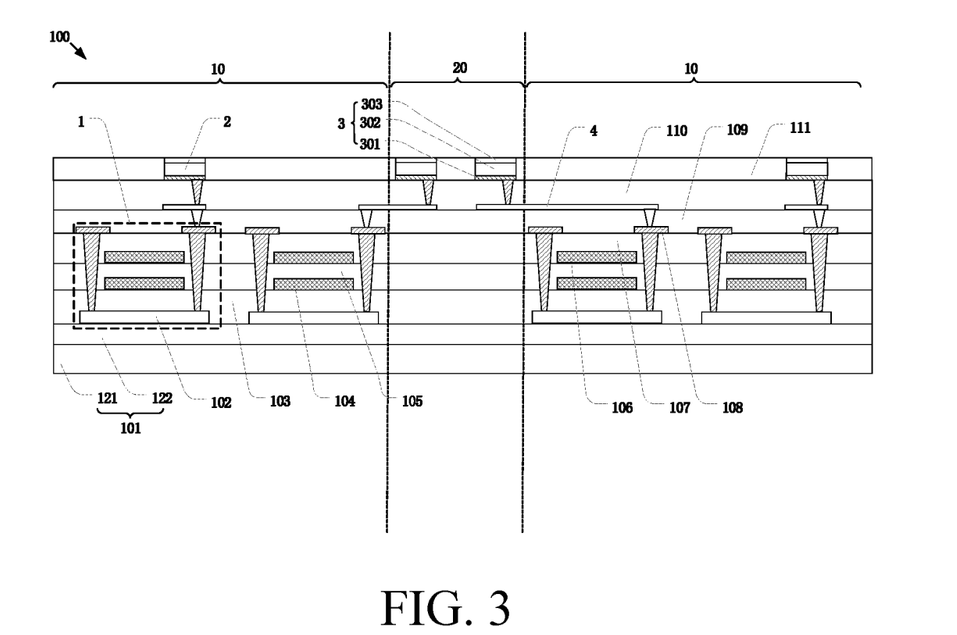
FIG. 3 is a schematic cross-sectional structural diagram of the display panel according to embodiment 1 of the present disclosure.

Referring to FIG. 3, in this embodiment, each of the transistor units 1 include a substrate layer 101, an active layer 102, a first gate insulating layer 103, a gate electrode layer 104, a second gate insulating layer 105, a source/drain electrode layer 108, and a first planarization layer 109. Specifically, the substrate layer 101 includes a flexible substrate layer 121 and a buffer layer 122, and the flexible substrate layer 121 and the buffer layer 122 may be disposed in multiple layers. The active layer 102 is disposed on the substrate layer 101, the first gate insulating layer 103 is disposed on the active layer 102, the gate electrode layer 104 is disposed on the first gate insulating layer 103, and the second gate insulating layer 105 is disposed on the gate electrode layer 104. The source/drain electrode layer 108 is disposed on the second gate insulating layer 105 and electrically connected to the active layer 102, and the first planarization layer 109 is disposed on the source/drain electrode layer 108. Wherein, the conductive wires 4 are disposed on the first planarization layer 109 and electrically connected to the source/drain electrode layer 108.

If the capacitor C1 in each of the pixel circuits is combined with each of the transistor units 1, each of the transistor units 1 may also include a capacitor metal layer 106 and an interlayer insulating layer 107. The capacitor metal layer 106 is disposed on the second gate insulating layer 105 and corresponds to the gate electrode layer 104 to form the capacitor C1. The interlayer insulating layer 107 is disposed on the second gate insulating layer 105 and covers the capacitor metal layer 106, and the source/drain electrode layer 108 is disposed on the interlayer insulating layer 107.

In this embodiment, a material of the conductive wires 4 and/or the source/drain electrode layer 108 is indium tin oxide. Indium tin oxide is a transparent material having transmittance above 90%, which can improve transmittance, thereby improving an intensity of light passing through the under-screen camera area 20.

In this embodiment, the display panel 100 also includes a second planarization layer 110 disposed on the conductive wires 4 and provided with via holes for the wires, and the conductive wires 4 penetrate through the via holes to be electrically connected to the second light-emitting pixel units 3. Specifically, distances between the second light-emitting pixel units 3 and the transistor units 1 in peripheries of the under-screen camera area 20 are as short as possible, so interlacing of the conductive wires 4 and light shielding of the under-screen camera can be further reduced.

In this embodiment, the display panel 100 also includes a pixel definition layer 111 disposed on the second planarization layer 110 and provided with grooves corresponding to the conductive wires 4, that is, pixel definition grooves, and the first light-emitting pixel units 2 and the second light-emitting pixel units 3 are disposed in the grooves.

In this embodiment, the display panel 100 also includes a thin film encapsulation layer disposed on the pixel definition layer and covering the first light-emitting pixel units 2 and the second light-emitting pixel units 3. The thin film encapsulation layer has a sandwich structure, which includes a three-layer structure of a first inorganic layer, an organic layer, and a second inorganic layer, and is used to protect the first light-emitting pixel units 2 and the second light-emitting pixel units 3 from being eroded by water and oxygen.

In this embodiment, each of the second light-emitting pixel units 3 includes an anode layer 301, a light-emitting layer 302, and a cathode layer 303. Each anode layer 301 is electrically connected to each of the conductive wires 4, the light-emitting layer 302 is disposed on the anode layer 301, and the cathode layer 303 is disposed on the light-emitting layer 302.

Figure 4:
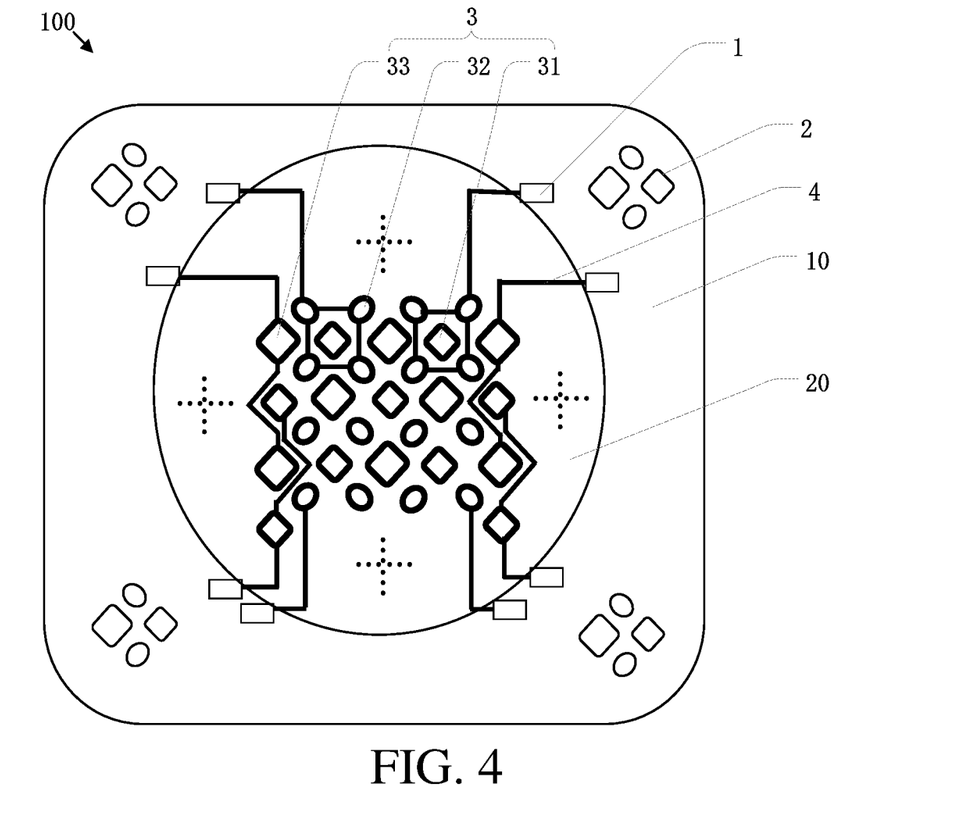
FIG. 4 is a schematic planar structural diagram of the display panel according to embodiment 2 of the present disclosure.

Referring to FIG. 4, in this embodiment, one of the transistor units 1 is electrically connected to a plurality of red sub-pixels 31 positioned in a same row by the one of the conductive wires 4, and another one of the transistor units 1 is electrically connected to a plurality of blue sub-pixels 33 positioned in the same row by the yet another one of the conductive wires 4.

In this embodiment, the red sub-pixels 31 and the blue sub-pixels 33 positioned in the same row are disposed alternatingly and spaced apart from each other, and the one of the conductive wires 4 connected to the red sub-pixels 31 and the yet another one of the conductive wires 4 connected to the blue sub-pixels 33 are respectively disposed on both sides of the row of the sub-pixels.

In this embodiment, the one of the transistor units 1 is electrically connected to two of the red sub-pixels 31 adjacent to each other and positioned in the same row by the one of the conductive wires 4, and the another one of the transistor units 1 is electrically connected to two of the blue sub-pixels 33 adjacent to each other and positioned in the same row by the yet another one of the conductive wires 4.

In this embodiment, yet another one of the transistor units 1 is electrically connected to four of the green sub-pixels 32 surrounding one of the red sub-pixels 31 or the blue sub-pixels 33 by the another one of the conductive wires 4.

More specifically, referring to FIG. 4, each of the peripheral transistor units 1 drives one or more of the second light-emitting pixel units 3 to emit light. Specifically, in FIG. 4, the another one of the conductive wires 4 is electrically connected to the four of the green sub-pixels 32, that is, the yet another one of the transistor units 1 corresponding to green color drives the four of the green sub-pixels 32 correspondingly. The one of the conductive wires 4 is electrically connected to the two of the red sub-pixels 31, that is, the one of the transistor units 1 corresponding to red color drives the two of the red sub-pixels 31 correspondingly. The yet another one of the conductive wires 4 is electrically connected to the two of the blue sub-pixels 33, that is, the another one of the transistor units 1 corresponding to blue color drives the two of the blue sub-pixels 33 correspondingly. That is, in FIG. 4, the sub-pixels having a same color are connected in series first and then connected to one transistor unit 1 corresponding thereto.

In this embodiment, the anode layers 301 corresponding to the sub-pixels having different colors are electrically connected in series by the conductive wires 4 inside or outside the under-screen camera area 20, so transmittance of the under-screen camera area 20 is improved, thereby improving the intensity of light passing through the under-screen camera area 20, enhancing sensitivity of the under-screen camera in the under-screen camera area 20, and reducing influences of diffracted light from metal slits.

Embodiment 2

Figure 5:
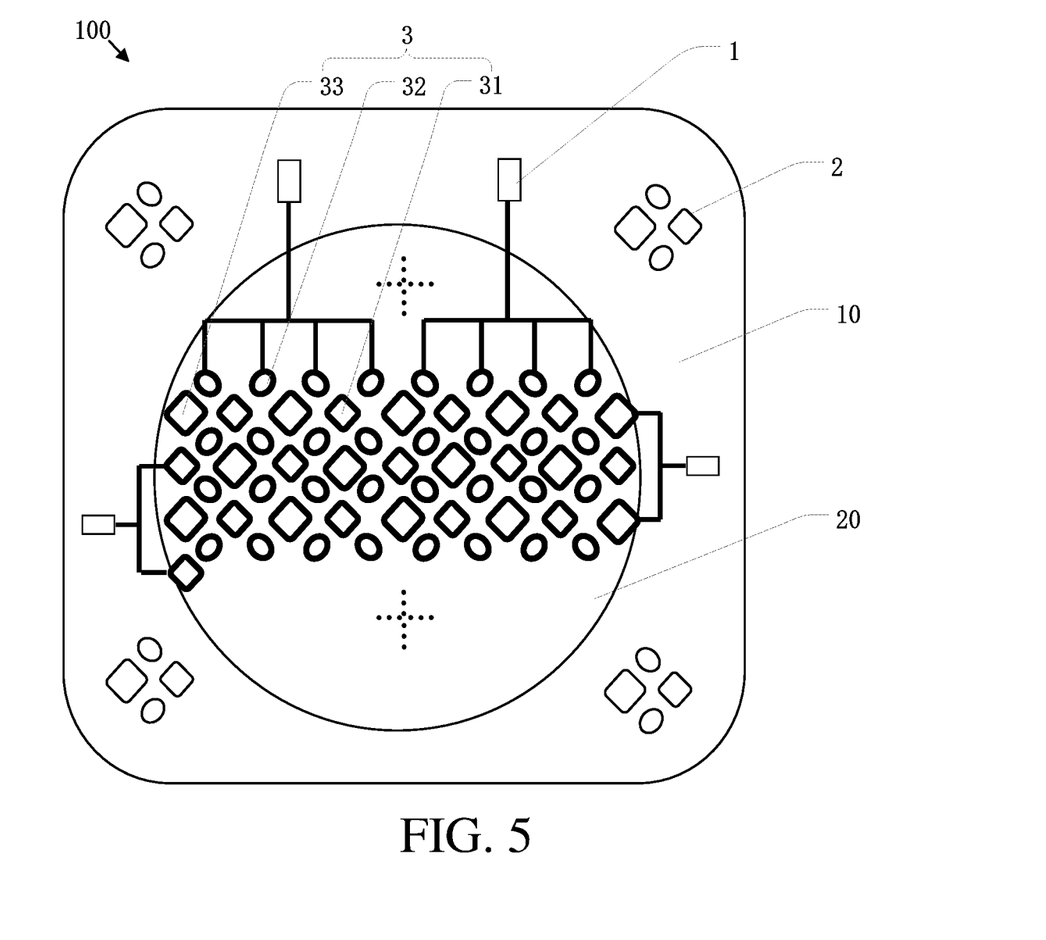
FIG. 5 is another schematic planar structural diagram of the display panel according to embodiment 2 of the present disclosure.

Referring to FIG. 5, embodiment 2 includes most technical features in embodiment 1, and a difference is that in embodiment 2, when each of the peripheral transistor units 1 drives one or more of the second light-emitting pixel units 3 to emit light, a plurality of the sub-pixels having the same color are respectively connected to one corresponding transistor unit 1 at a same time, while not like that in embodiment 1 which are connected in series first and then connected to the one transistor unit 1 corresponding thereto.

In this embodiment, the one of the transistor units 1 is electrically connected to a plurality of the red sub-pixels 31 positioned in the same row by the one of the conductive wires 4, and the another one of the transistor units 1 is electrically connected to a plurality of the blue sub-pixels 33 positioned in the same row by the yet another one of the conductive wires 4. The red sub-pixels 31 and the blue sub-pixels 33 positioned in the same row are disposed alternatingly and spaced apart from each other, and the one of the conductive wires 4 connected to the red sub-pixels 31 and the yet another one of the conductive wires 4 connected to the blue sub-pixels 33 are respectively disposed on both sides of the row of the sub-pixels. The one of the transistor units 1 is electrically connected to two of the red sub-pixels 31 adjacent to each other and positioned in the same row by the one of the conductive wires 4, and the another one of the transistor units 1 is electrically connected to two of the blue sub-pixels 33 adjacent to each other and positioned in the same row by the yet another one of the conductive wires 4. The yet another one of the transistor units 1 is electrically connected to a plurality of the green sub-pixels 32 positioned in a same row by the another one of the conductive wires 4, and a number of the green sub-pixels 32 connected to the another one of the conductive wires 4 is preferably four.

This embodiment can effectively reduce a number of layers of upper and lower layered wirings of the conductive wires 4 by internal wire connection of the conductive wires 4, thereby effectively reducing complexity of processes and cost.

Specifically, as shown in FIG. 5, when each of the peripheral transistor units 1 drives one or more of the second light-emitting pixel units 3 to emit light, the another one of the conductive wires 4 is electrically connected to the four of the green sub-pixels 32, that is, the yet another one of the transistor units 1 corresponding to green color drives the four of the green sub-pixels 32 correspondingly. The one of the conductive wires 4 is electrically connected to the two of the red sub-pixels 31, that is, the one of the transistor units 1 corresponding to red color drives the two of the red sub-pixels 31 correspondingly. The yet another one of the conductive wires 4 is electrically connected to the two of the blue sub-pixels 33, that is, the another one of the transistor units 1 corresponding to blue color drives the two of the blue sub-pixels 33 correspondingly. In FIG. 5, the sub-pixels having the same color are respectively connected to the corresponding transistor unit 1 at the same time, so the conductive wires 4 in a same layer of wirings being connected to a plurality of the sub-pixels having the same color can be realized, and the conductive wires 4 for connecting the sub-pixels having another same color may be disposed in a different layer.

Figure 6:
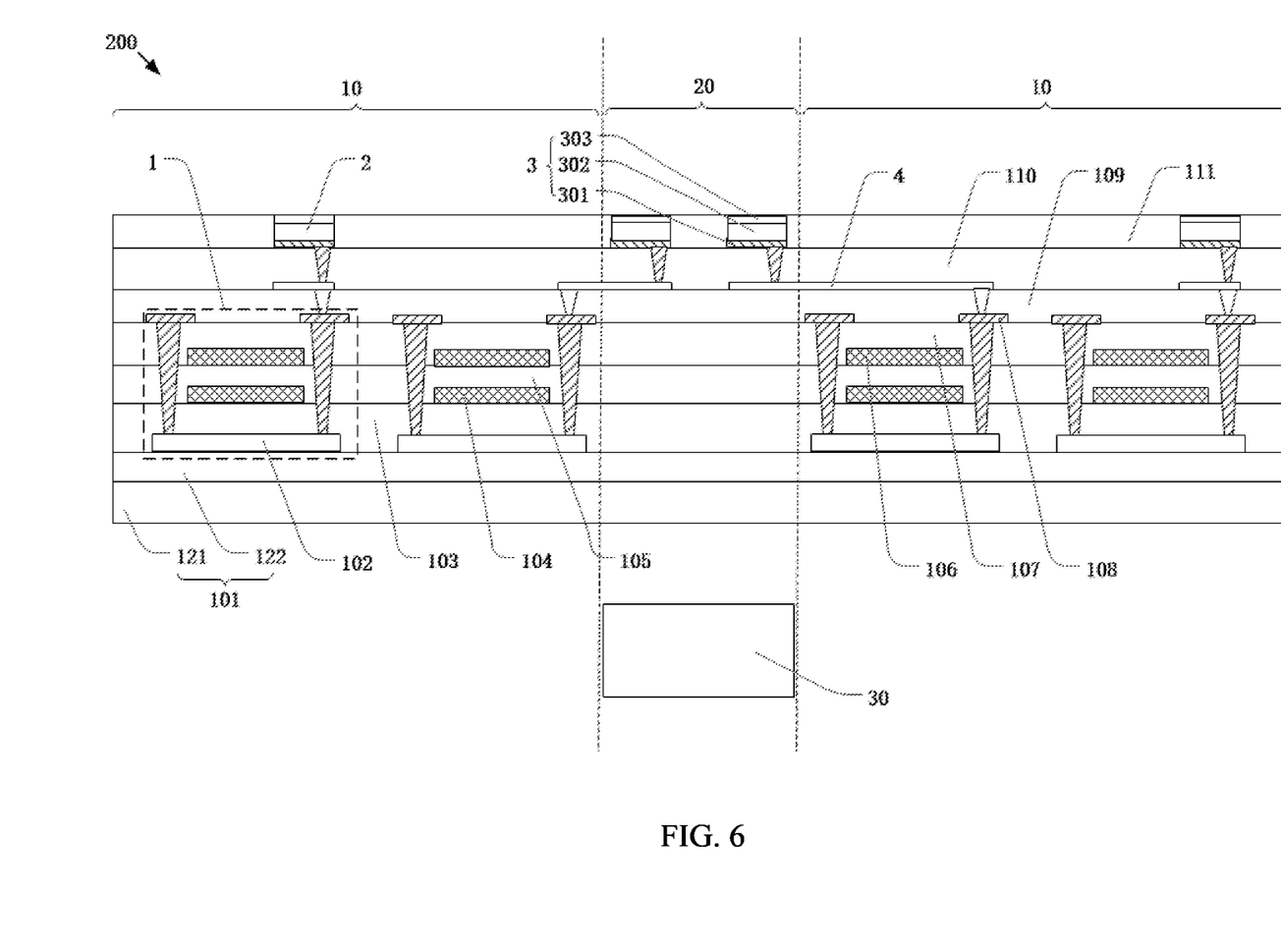
FIG. 6 is a schematic structural diagram of a display device according to an embodiment of the present disclosure.

Referring to FIG. 6, the present disclosure further provides a display device 200, which includes the display panel 100 described above and a sensor 30, wherein, the sensor 30 is disposed corresponding to the under-screen camera area 20.

In this embodiment, the sensor 30 includes one of a camera sensor, a breathing light sensor, a distance sensor, a fingerprint scanner sensor, a microphone sensor, or a transparent antenna sensor, or combinations thereof.

The display device 200 of the present disclosure can be applied to various occasions, and can be combined with various devices and structures. The display device 200 can be a mobile terminal (a mobile phone or a smart wearable device), a fixed terminal (personal computer, PC), or other devices having display functions, such as a tablet computer, a TV, a display window, etc. It should be understood that in order to achieve functions, the display device 200 of the present disclosure has other devices and structures not shown in this specification.

Beneficial effects of the present disclosure are that the display panel and the display device provided can improve the transmittance of the under-screen camera area by driving one or more of the second light-emitting pixel units by each of the transistor units positioned surrounding the under-screen camera area, which electrically connects the anode layers corresponding to the sub-pixels having different colors together by the conductive wires inside or outside the under-screen camera area, thereby improving the intensity of light passing through the under-screen camera area, enhancing the sensitivity of the under-screen camera in the under-screen camera area, and reducing the influences of diffracted light from metal slits.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. A display panel, comprising:
a display area and an under-screen camera area;
wherein the display area is provided with a plurality of transistor units and first light-emitting pixel units driven by the transistor units;
the under-screen camera area is provided with a plurality of second light-emitting pixel units, the transistor units are disposed surrounding the under-screen camera area, and each of the transistor units disposed surrounding the under-screen camera area in the display area is electrically connected to a plurality of the second light-emitting pixel units by each of conductive wires; and
wherein a density of the second light-emitting pixel units in the under-screen camera area is less than or equal to a density of the first light-emitting pixel units in the display area.

2. The display panel according to claim 1, wherein the second light-emitting pixel units comprise red sub-pixels, green sub-pixels, and blue sub-pixels arranged in the under-screen camera area in an array;
one of the conductive wires is electrically connected to the red sub-pixels of the plurality of the second light-emitting pixel units;
another one of the conductive wires is electrically connected to the green sub-pixels of the plurality of the second light-emitting pixel units; and
yet another one of the conductive wires is electrically connected to the blue sub-pixels of the plurality of the second light-emitting pixel units.

3. The display panel according to claim 2, wherein one of the transistor units is electrically connected to the red sub-pixels positioned in a same row by the one of the conductive wires, and another one of the transistor units is electrically connected to the blue sub-pixels positioned in the same row by the yet another one of the conductive wires.

4. The display panel according to claim 3, wherein the red sub-pixels and the blue sub-pixels positioned in the same row are disposed alternatingly and spaced apart from each other, and the one of the conductive wires connected to the red sub-pixels and the yet another one of the conductive wires connected to the blue sub-pixels are respectively disposed on both sides of the row of the sub-pixels.

5. The display panel according to claim 3, wherein the one of the transistor units is electrically connected to two of the red sub-pixels adjacent to each other and positioned in the same row by the one of the conductive wires, and the another one of the transistor units is electrically connected to two of the blue sub-pixels adjacent to each other and positioned in the same row by the yet another one of the conductive wires.

6. The display panel according to claim 2, wherein one of the transistor units is electrically connected to the green sub-pixels positioned in a same row by the another one of the conductive wires.

7. The display panel according to claim 2, wherein one of the transistor units is electrically connected to four of the green sub-pixels surrounding one of the red sub-pixels or the blue sub-pixels by the another one of the conductive wires.

8. The display panel according to claim 1, wherein the conductive wires are linear, wavy, arc-shaped, or S-shaped.

9. The display panel according to claim 1, wherein a material of the conductive wires is indium tin oxide.

10. A display device, comprising the display panel according to claim 1 and a sensor, wherein the sensor is disposed corresponding to the under-screen camera area.

* * * * *